(12) United States Patent
Tang et al.

(10) Patent No.: US 12,027,543 B2
(45) Date of Patent: Jul. 2, 2024

(54) ARRAY SUBSTRATE AND DISPLAY PANEL

(71) Applicant: WUHAN CHINA STAR OPTOELECTRONICS TECHNOLOGY CO., LTD., Wuhan (CN)

(72) Inventors: Fuhsiung Tang, Wuhan (CN); Fan Gong, Wuhan (CN); Fei Ai, Wuhan (CN); Jiyue Song, Wuhan (CN)

( * ) Notice: Subject to any disclaimer, the term of this patent is extended or adjusted under 35 U.S.C. 154(b) by 546 days.

(21) Appl. No.: 17/281,268

(22) PCT Filed: Mar. 11, 2021

(86) PCT No.: PCT/CN2021/080129
§ 371 (c)(1),
(2) Date: Mar. 30, 2021

(87) PCT Pub. No.: WO2022/165913
PCT Pub. Date: Aug. 11, 2022

(65) Prior Publication Data
US 2023/0154949 A1    May 18, 2023

(30) Foreign Application Priority Data
Feb. 3, 2021  (CN) .......................... 202110147331.8

(51) Int. Cl.
*H01L 27/146*   (2006.01)
*G06V 40/13*    (2022.01)

(52) U.S. Cl.
CPC .... *H01L 27/14612* (2013.01); *G06V 40/1318* (2022.01); *H01L 27/14678* (2013.01)

(58) Field of Classification Search
CPC ........ H01L 27/14612; H01L 27/14678; G06V 40/1318
USPC ....................................................... 275/449
See application file for complete search history.

(56) References Cited

U.S. PATENT DOCUMENTS

| | | | |
|---|---|---|---|
| 2002/0171077 A1* | 11/2002 | Chu ............... | H01L 31/035254 257/E27.128 |
| 2009/0278121 A1* | 11/2009 | Kakkad ............... | H01L 31/147 257/E33.044 |
| 2009/0286336 A1* | 11/2009 | Cho ................... | H01L 27/1214 257/E33.076 |
| 2021/0225923 A1* | 7/2021 | He ................... | H01L 27/14645 |
| 2021/0233954 A1* | 7/2021 | Hua ..................... | G01T 1/2018 |
| 2021/0313364 A1* | 10/2021 | Li ...................... | G06V 40/1318 |

FOREIGN PATENT DOCUMENTS

| CN | 101494202 A | 7/2009 |
|---|---|---|
| CN | 101577285 A | 11/2009 |
| CN | 101663758 A | 3/2010 |

(Continued)

*Primary Examiner* — Igwe U Anya (57) ABSTRACT

An array substrate and a display panel are provided. The array substrate includes a substrate, and a switch component and a light-sensing component adjacent to each other and disposed on the substrate. The switch component includes a first semiconductor disposed on the substrate. The light-sensing component includes a second semiconductor disposed on a same layer as the first semiconductor and a light-sensing electrode disposed on a side of the second semiconductor away from the substrate and connected to the second semiconductor. The light-sensing electrode and the second semiconductor constitute a Schottky knot.

20 Claims, 6 Drawing Sheets

(56) References Cited

FOREIGN PATENT DOCUMENTS

| | | | |
|---|---|---|---|
| CN | 105373772 | A | 3/2016 |
| CN | 105913021 | A | 8/2016 |
| CN | 106326845 | A | 1/2017 |
| CN | 106876332 | A | 6/2017 |
| CN | 107204172 | A | 9/2017 |
| CN | 107425038 | A | 12/2017 |
| CN | 107894671 | A | 4/2018 |
| CN | 108710237 | A | 10/2018 |
| CN | 109004007 | A | 12/2018 |
| CN | 109950235 | A | 6/2019 |
| CN | 109962114 | A | 7/2019 |
| CN | 110210442 | A | 9/2019 |
| CN | 110729309 | A | 1/2020 |
| CN | 111258096 | A | 6/2020 |
| CN | 111276517 | A | 6/2020 |
| CN | 111384072 | A | 7/2020 |
| CN | 111430386 | A | 7/2020 |
| CN | 111653599 | A | 9/2020 |
| CN | 111753627 | A | 10/2020 |
| CN | 111785766 | A | 10/2020 |
| CN | 112242407 | A | 1/2021 |
| JP | 2006061630 | A | 3/2006 |
| JP | 2006091462 | A | 4/2006 |
| JP | 2008058976 | A | 3/2008 |
| KR | 20160032754 | A | 3/2016 |
| WO | 2020186428 | A1 | 9/2020 |

\* cited by examiner

ARRAY SUBSTRATE AND DISPLAY PANEL

FIELD

The present disclosure relates the field of display technologies, and more particularly, to an array substrate and a display panel.

BACKGROUND

Nowadays, fingerprint recognition technologies are widely used in panels of medium and small sizes and mainly include capacitive fingerprint recognition, ultrasonic fingerprint recognition, and optical fingerprint recognition. Compared with capacitive fingerprint recognition and ultrasonic fingerprint recognition, optical fingerprint recognition has good stability, strong antistatic ability, improved penetration ability, and low cost. Refraction and reflection of light are applied to optical fingerprint recognition technologies. Specifically, when light is irradiated on a finger, a light sensor receives the light reflected by the finger and converts a light signal into an electrical signal which is to be read.

Regarding the technical issue, a light-sensing area of light-sensing components in conventional light sensors is small, leading to low sensitivity of the light-sensing components.

SUMMARY

The present disclosure provides an array substrate and a display panel to solve a following issue: a light-sensing area of light-sensing components in conventional light sensors is small, leading to low sensitivity of the light-sensing components.

The present disclosure provides an array substrate, including:
 a substrate;
 a switch component disposed on the substrate, wherein the switch component includes a first semiconductor disposed on the substrate; and
 a light-sensing component disposed on the substrate and adjacent to the switch component, wherein the light-sensing component includes a second semiconductor and a light-sensing electrode, the second semiconductor and the first semiconductor are disposed on a same layer, and the light-sensing electrode is disposed on a side of the second semiconductor away from the substrate and is connected to the second semiconductor;
 wherein the light-sensing electrode and the second semiconductor form a Schottky junction.

In the array substrate provided by the present disclosure, the second semiconductor is an intrinsic semiconductor or an N-type semiconductor.

In the array substrate provided by the present disclosure, the first semiconductor includes a first doping part, a second doping part, a channel part, a third doping part, and a fourth doping part which are sequentially disposed along a horizontal direction, and the fourth doping part is connected to the second semiconductor; and
 wherein the first doping part and the fourth doping part are N-type heavily doped, and the second doping part, the third doping part, and the second semiconductor are N-type lightly doped.

In the array substrate provided by the present disclosure, the switch component further includes:
 a gate disposed on a side of the first semiconductor away from the substrate and insulated from the first semiconductor; and
 an input electrode disposed on the side of the first semiconductor away from the substrate and connected to an end of the first semiconductor away from the second semiconductor.

In the array substrate provided by the present disclosure, the array substrate further includes a thin film transistor (TFT) layer, and the switch component and the light-sensing component are disposed in the TFT layer.

In the array substrate provided by the present disclosure, the TFT layer further includes:
 a semiconductor layer disposed on the substrate and including the first semiconductor and the second semiconductor;
 a gate insulating layer disposed on the semiconductor layer;
 a gate layer disposed on the gate insulating layer and including the gate;
 an interlayer insulating layer disposed on the gate insulating layer and the gate layer, wherein the interlayer insulating layer includes a first through-hole penetrating the interlayer insulating layer and extending to the side of the first semiconductor away from the substrate; and
 a source/drain electrode layer disposed on the interlayer insulating layer, wherein the source/drain electrode layer includes the input electrode, and the input electrode is connected to the first semiconductor layer by the first through-hole.

In the array substrate provided by the present disclosure, the TFT layer further includes: a planarization layer disposed on the source/drain electrode layer and the interlayer insulating layer, wherein the planarization layer includes a second through-hole penetrating the planarization layer and exposing a side of the interlayer insulating layer away from the substrate;
 a common electrode layer disposed on the planarization layer; and
 a passivation layer disposed on the common electrode layer and the planarization layer, wherein the passivation layer includes a third through-hole penetrating the passivation layer and extending to a side of the second semiconductor away from the substrate by the second through-hole, a diameter of the second through-hole is greater than a diameter of the third through-hole, and the passivation layer covers an inner lateral wall of the second through-hole;
 wherein the light-sensing electrode is connected to the second semiconductor by the third through-hole.

In the array substrate provided by the present disclosure, the array substrate further includes a pixel electrode layer disposed on the passivation layer;
 wherein the light-sensing electrode and the pixel electrode layer are disposed on a same layer.

In the array substrate provided by the present disclosure, the source/drain electrode includes a source, a drain, a touch control, and a fingerprint signal electrode, the common electrode layer includes a touch control wire and a first electrode, and the pixel electrode layer includes a pixel electrode, a second electrode, and a signal connecting line.

In the array substrate provided by the present disclosure, the planarization layer further includes a fourth through-hole, a fifth through-hole, and a sixth through-hole, the fourth through-hole exposes a side of the fingerprint signal electrode away from the substrate, the fifth through-hole exposes a side of the drain away from the substrate, and the sixth through-hole exposes a side of the touch control electrode away from the substrate; and the passivation layer further includes a seventh through-hole and an eighth through-hole, the seventh through-hole corresponds to the fourth through-hole, the passivation layer covers an inner lateral wall of the fourth through-hole, the eighth through-hole corresponds to the fifth through-hole, and the passivation layer covers an inner lateral wall of the fifth through-hole.

In the array substrate provided by the present disclosure, the array substrate further includes a pixel electrode layer disposed on the passivation layer. The pixel electrode layer a pixel electrode, a second electrode, and a signal connecting line;

wherein the light-sensing electrode and the pixel electrode layer are disposed on a same layer.

In the array substrate provided by the present disclosure, the light-sensing electrode is connected to the signal connecting line, the signal connecting line is connected to the fingerprint signal electrode by the seventh through-hole, the pixel electrode is connected to the drain by the eighth through-hole, and the touch control electrode is connected to the touch control wire by the sixth through-hole.

In the array substrate provided by the present disclosure, the array substrate includes a display area and a dummy pixel area, the display area is positioned on at least one side of the display area, and the switch component and the light-sensing component are disposed in the dummy pixel area.

In the array substrate provided by the present disclosure, the array substrate includes a light-shielding part disposed on a side of the substrate near the first semiconductor, and a projection of the light-shielding part on the substrate at least covers a projection of the first semiconductor on the substrate.

In the array substrate provided by the present disclosure, the projection of the light-shielding part on the substrate covers the projection of the first semiconductor on the substrate and a projection of the second semiconductor on the substrate.

In the array substrate provided by the present disclosure, a material of the light-sensing electrode includes indium zinc oxide, zinc oxide, or indium gallium zinc oxide.

In the array substrate provided by the present disclosure, the first semiconductor and the second semiconductor are polysilicon.

In the array substrate provided by the present disclosure, a thickness of the second semiconductor ranges from 400 Å to 600 Å.

The present disclosure further provides a display panel, including an array substrate, wherein the array substrate includes:

a substrate;

a switch component disposed on the substrate, wherein the switch component includes a first semiconductor disposed on the substrate; and a light-sensing component disposed on the substrate and adjacent to the switch component, wherein the light-sensing component includes a second semiconductor and a light-sensing electrode, the second semiconductor and the first semiconductor are disposed on a same layer, and the light-sensing electrode is disposed on a side of the second semiconductor away from the substrate and is connected to the second semiconductor;

wherein the light-sensing electrode and the second semiconductor form a Schottky junction.

In the array substrate provided by the present disclosure, the second semiconductor is an intrinsic semiconductor or an N-type semiconductor.

In the array substrate provided by the present disclosure, a material of the light-sensing electrode includes indium zinc oxide, zinc oxide, or indium gallium zinc oxide.

Regarding the beneficial effects: the present disclosure provides an array substrate and a display panel. The array substrate includes a light-sensing component disposed on the substrate and adjacent to the switch component. The light-sensing component includes a second semiconductor and a light-sensing electrode. The light-sensing electrode is disposed on a side of the second semiconductor away from the substrate and is connected to the second semiconductor. The light-sensing electrode and the second semiconductor form a Schottky junction, thereby increasing an effective light-sensing area of the light-sensing component. Moreover, the light-sensing component forms a built-in electric field in a vertical direction after receiving light. Therefore, electron-hole pairs can be separated more effectively, photocurrents can be increased, and sensitivity of the light-sensing component is improved.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure. Embodiments, which are based on the embodiments of the present disclosure, obtained by those skilled in the art without making any inventive efforts are within the scope of protection defined by the present disclosure.

Figure 1:
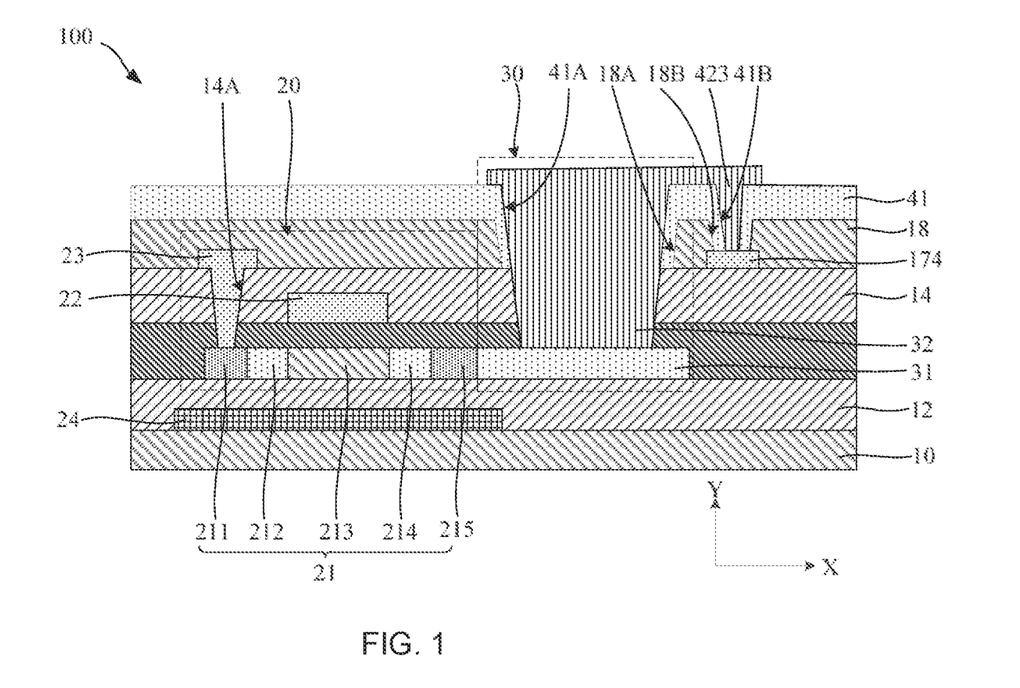
FIG. 1 is a first structural schematic view showing an array substrate provided by the present disclosure.

Please refer to FIG. 1, a first structural schematic view of an array substrate is provided. As shown in FIG. 1, an array substrate 100 includes a substrate 10, a switch component 20, and a light-sensing component 30. The switch component 20 is disposed on the substrate 10. The switch component 20 includes a first semiconductor 21. The first semiconductor 21 is disposed on the substrate 10. The light-sensing component 30 and the switch component 20 are adjacent to each other on the substrate 10. The light-sensing component 30 includes a second semiconductor 31 and a light-sensing electrode 32. The second semiconductor 31 and the first semiconductor 21 are connected to each other and are disposed on a same layer. The light-sensing electrode 32 is disposed on a side of the second semiconductor 31 away from the substrate 10 and is connected to the second semiconductor 31. The light-sensing electrode 32 and the second semiconductor 31 form a Schottky junction.

Accordingly, in the array substrate 100 provided by the present embodiment, the switch component 20 and the light-sensing component 30 work together, thereby realizing functions such as under-display optical fingerprint recognition. The light-sensing component 30 includes the second semiconductor 31 and the light-sensing electrode 32 which are stacked, and the Schottky junction is formed between the second semiconductor 31 and light-sensing electrode 32, thereby increasing effective light-sensing area of the light-sensing component 30. Moreover, the light-sensing component 30 forms a built-in electric field in a vertical direction Y after receiving light. Therefore, electron-hole pairs can be separated more effectively, photocurrents can be increased, and sensitivity of the light-sensing component 30 is improved. In addition, compared with conventional technologies, the light-sensing component 30 provided by the present embodiment does not need to include an additional light-sensing layer. Therefore, masks and production costs can be reduced.

Wherein, the Schottky junction is an interface between a metal and a semiconductor and is similar to a P-N junction that has a non-linear impedance characteristic. In 1938, W. H. Schottky, a German physicist, established a theoretical model to provide a scientific explanation about the characteristic. Therefore, an interface between a metal and a semiconductor was later called a Schottky junction or a Schottky barrier.

In the present embodiment, the substrate 10 may be a glass substrate, a quartz substrate, a resin substrate, a polyimide (PI) flexible substrate, or other substrates which are not described here in detail.

In the present embodiment, the switch component 20 is configured to provide a bias voltage required by the light-sensing component 30 during working. The switch component 20 is a bottom-gate thin-film transistor (TFT) or a top-gate TFT. The switch components 20 described in the following embodiments of the present disclosure are top-gate TFTs, but are not limited thereto.

Specifically, the switch component 20 further includes a gate 22 and an input electrode 23. The gate 22 is disposed on a side of the first semiconductor 21 away from the substrate 10. The gate 22 and the first semiconductor 21 are insulated from each other. The input electrode 23 is disposed on the side of the first semiconductor 21 away from the substrate 10 and is connected to an end of the first semiconductor 21 away from the second semiconductor 31.

Wherein, the input electrode 23 is configured to be connected to a bias voltage. The switch component 20 transmits a bias voltage to the light-sensing component 30, leading to a reverse-biased light-sensing component 30. Then, the switch component 20 is closed. After incident light is emitted on the light-sensing component 30, the light-sensing component 30 is excited to generate photogenerated charges, and a photocurrent signal required by under-screen optical fingerprint recognition is generated.

A material of the first semiconductor 21 is polysilicon. A material of the gate 22 and the input electrode 23 may be a single layer of metal or stacked layers of different metals which have improved conductivity. For example, the material of the gate 22 is Ag, Al, Cu, Mo, a Mo/Al/Mo stacked layer, or a Mo/Cu stacked layer.

In the present embodiment, the first semiconductor 21 includes a first doping part 211, a second doping part 212, a channel part 213, a third doping part 214, and a fourth doping part 215 sequentially disposed on the substrate 10 along a horizontal direction X. The fourth doping part 215 is connected to the second semiconductor 31. Specifically, the first doping part 211, the second doping part 212, the channel part 213, the third doping part 214, and the fourth doping part 215 are sequentially connected to each other along the horizontal direction X. The gate 22 corresponds to the channel part 213. The input electrode 23 is connected to the first doping part 211.

The first doping part 211 and the fourth doping part 215 are N-type heavily doped. The second doping part 212 and the third doping part 214 are N-type lightly doped. The channel part 213 is an intrinsic semiconductor.

Specifically, the first doping part 211, the second doping part 212, the third doping part 214, and the fourth doping part 215 are formed by doping phosphorus ions into the first semiconductor 21. Wherein, a difference between the N-type heavily doped part and the N-type lightly doped part is a doping concentration.

In the present embodiment, a material of the first semiconductor 21 and a material of the second semiconductor 31 are polysilicon. In conventional low-temperature polysilicon (LTPS) processes, a thickness of the first semiconductor 21 and a thickness of the second semiconductor 31 are relatively small due to limitations of excimer laser annealing processes. If a built-in electric field exists only in the horizontal direction, photoelectric responses of the light-sensing component 30 to incident light would be low. As a result, a number of electron-hole pairs would be reduced, affecting sensitivity of the light-sensing component 30.

In the present embodiment, since a Schottky junction having a stacked structure is formed between the second semiconductor 31 and the light-sensing electrode 32, effective light-sensing area of the light-sensing component 30 is increased. Furthermore, a built-in electric field is formed in the vertical direction Y after the light-sensing component 30 receives light, thereby increasing photocurrents. Thus, a thickness of the second semiconductor 31 can be very small. Specifically, the thickness of the second semiconductor 31 ranges from 400 Å to 600 Å. For example, the thickness of the second semiconductor 31 is 400 Å, 450 Å, 500 Å, 550 Å, or 600 Å.

Furthermore, in the present embodiment, the thickness of the first semiconductor 21 may be equal to a thickness of the second semiconductor 31. The thickness of the first semiconductor 21 ranges from 400 Å to 600 Å. For example, the thickness of the first semiconductor 21 is 400 Å, 450 Å, 500 Å, 550 Å, or 600 Å. The first semiconductor 21 and the second semiconductor 31 may be formed in a same process.

In the present embodiment, the second semiconductor 31 is an N-type semiconductor. Specifically, the second semiconductor 31, the second doping part 212, and the third doping part 214 are N-type lightly doped. In conventional LTPS processes, ions are doped into an entire surface of the first semiconductor 21 to form the second doping part 212 and the third doping part 214. In the present embodiment, since the second semiconductor 31 and the first semiconductor 21 are disposed on the same layer, the N-typed second semiconductor 31 can be together formed when the second doping part 212 and the third doping part 214 are manufactured. Therefore, strength of a built-in electric field is enhanced, and manufacturing processes are simplified.

In the present embodiment, a material of the light-sensing electrode 32 is a conductive material having high work function, thereby forming a Schottky junction between the light-sensing electrode 32 and the second semiconductor 31. Wherein, the conductive material having high work function may be indium zinc oxide, zinc oxide, or indium gallium zinc oxide.

In addition, the array substrate 100 further includes a buffer layer 12, a gate insulating layer 13, an interlayer insulating layer 14, a planarization layer 18, and a passivation layer 41. The buffer layer 12 is disposed on a side of the substrate 10 near the first semiconductor 21 and covers the substrate 10. The gate insulating layer 13 is disposed on a side of the gate 22 near the substrate 10 and covers the first semiconductor 21, the second semiconductor 31, and the buffer layer 12. The interlayer insulating layer 14 is disposed on a side of the gate 22 away from the substrate 10 and covers the gate 22 and the gate insulating layer 13. The interlayer insulating layer 14 includes a first through-hole 14A. The first through-hole 14A penetrates the interlayer insulating layer 14 and extends to a side of the first semiconductor 21 away from the substrate 10. The planarization layer 18 is disposed on a side of the interlayer insulating layer 14 away from the substrate 10 and covers the input electrode 23. The planarization layer 18 includes a second through-hole 18A. The second through-hole 18A penetrates the planarization layer 18 and exposes the side of the interlayer insulating layer 14 away from the substrate 10. The passivation layer 41 is disposed on the planarization layer 18. The passivation layer 41 includes a third through-hole 41A. The third through-hole 41A penetrates the passivation layer 41 and extends to a side of the second semiconductor 31 away from the substrate 10 by the second through-hole 18A. A diameter of the second through-hole 18A is greater than a diameter of the third through-hole 41A, and the passivation layer 41 covers an inner lateral wall of the second through-hole 18A.

Wherein, the input electrode 23 is connected to the first semiconductor 21 by the first through-hole 14A. The light-sensing electrode 32 is connected to the second semiconductor 31 by the third through-hole 41A.

Wherein, the buffer layer 12, the gate insulating layer 13, and the interlayer insulating layer 14 may be a single layer formed of silicon oxide, silicon nitride, or silicon oxynitride. Also, the interlayer insulating layer 14 may be a stacked layer formed of silicon oxide and silicon nitride stack. The buffer layer 12 is a transition layer between the first semiconductor 21, the second semiconductor 31, and the substrate 10 and firmly connects the first semiconductor 21, the second semiconductor 31, and the substrate 10 with each other. The gate insulating layer 13 and the interlayer insulating layer 14 have an isolating function.

Please refer to FIG. 1 again, in the present embodiment, the array substrate 100 further includes a light-shielding part 24. The light-shielding part 24 is disposed on a side of the substrate 10 near the first semiconductor 21. A projection of the light-shielding part 24 on the substrate at least covers a projection of the first semiconductor 21 on the substrate 10.

Wherein, the light-shielding part 24 has a single-layer structure or a stacked-layer structure, which are formed of an opaque material. The opaque material may be Mo, Ti, a Mo/Ti stacked layer, or a Ti/Al stacked layer. The light-shielding part 24 can receive external light from a side of the substrate 10, thereby preventing a working function of the switch component 20 from being affected when external light is emitted on the channel part 213. Furthermore, the light-shielding part 24 prevents display effect of the display panel from being affected when external light is reflected on the display panel by the switch component 20.

Figure 2:
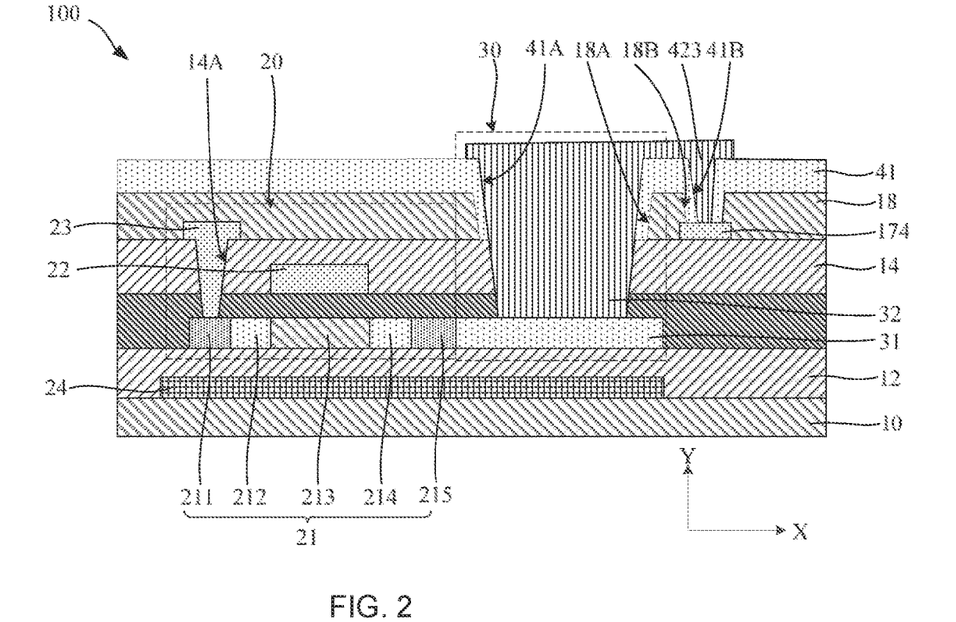
FIG. 2 is a second structural schematic view showing the array substrate provided by the present disclosure.

In another embodiment of the present disclosure, please refer to FIG. 2, a second structural schematic view of the array substrate is provided. A difference between the array substrate 100 of the present embodiment and the array substrate 100 in FIG. 1 is: in the array substrate 100 provided by the present disclosure, a projection of the light-shielding part 24 on the substrate 10 completely covers a projection of the first semiconductor 21 on the substrate 10 and a projection of the second semiconductor 31 on the substrate 10.

It should be understood that the second semiconductor 31 would generate charge carriers after being exposed to light. Therefore, when the second semiconductor 31 receives external light from a side of the substrate 10, photocurrents would be generated, affecting sensing accuracy of the light-sensing component 30. In the present embodiment, the light-shielding part 24 is disposed to block external light from the side of the substrate 10. As a result, the light-sensing component 30 can be ensured to only receive light required by under-display optical fingerprint recognition, thereby improving sensing accuracy of the light-sensing component 30.

Figure 3:
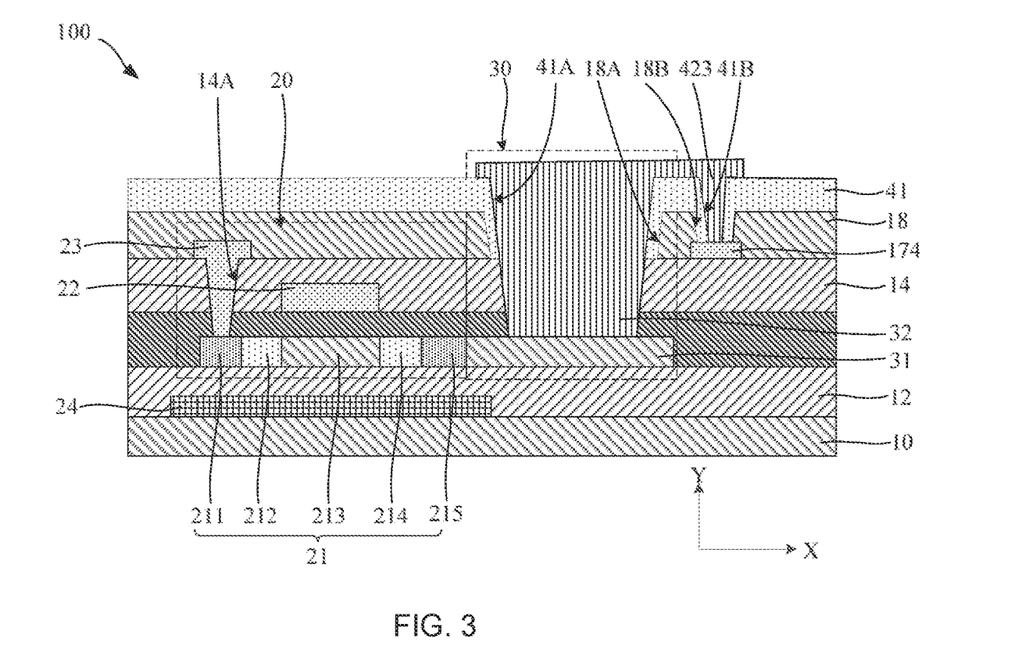
FIG. 3 is a third structural schematic view showing the array substrate provided by the present disclosure.

In yet another embodiment of the present disclosure, please refer to FIG. 3, a third structural schematic view of the array substrate is provided. A difference between the array substrate 100 in FIG. 1 and the array substrate 100 of the present embodiment is: in the array substrate 100 provided by the present embodiment, the second semiconductor 31 is an intrinsic semiconductor.

Specifically, the second semiconductor 31 and the channel part 213 are intrinsic semiconductors. When injecting ions into the first semiconductor 21 to form the second doping part 212 and the third doping part 214, an additional mask plate can be used to prevent ions from being doped into the second semiconductor 31.

Figure 4:
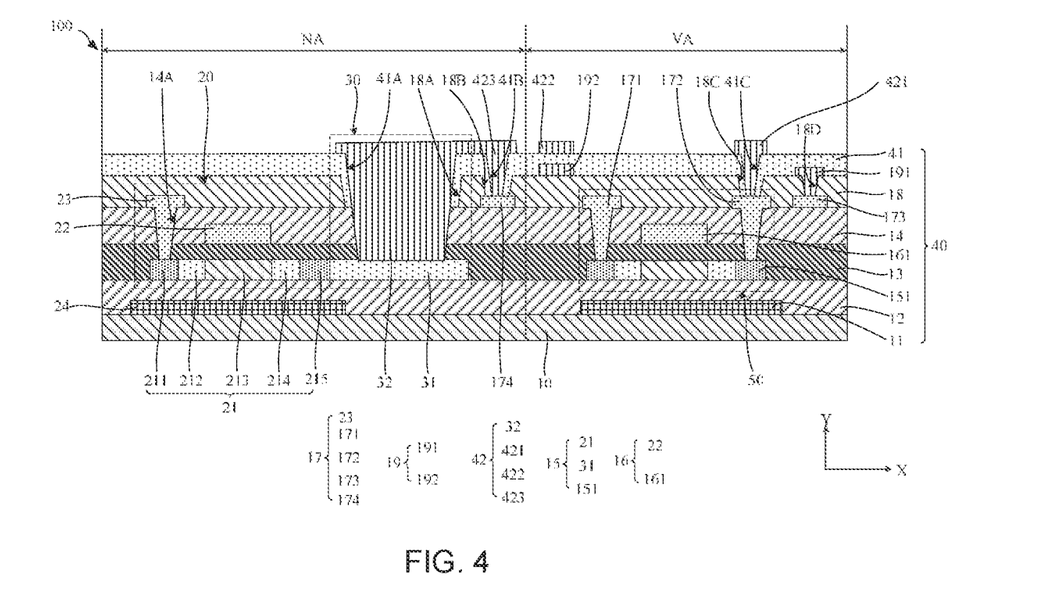
FIG. 4 is a fourth structural schematic view showing the array substrate provided by the present disclosure.

As shown in FIG. 4, a fourth structural schematic view of the array substrate is provided. A difference between the array substrate 100 in FIG. 1 and the array substrate 100 of the present embodiment is: the array substrate 100 provided by the present embodiment further includes a thin-film transistor (TFT) layer 40. The switch component 20 and the light-sensing component 30 are disposed in the TFT layer 40. Moreover, the light-sensing electrode 32 is connected to the second semiconductor 31 by a fourth through-hole 41B.

Since the switch component 20 and the light-sensing component 30 are disposed in the TFT layer 40, the switch component 20 and the light-sensing component 30 can be simultaneously formed during conventional manufacturing processes of the TFT layer 40. Therefore, the manufacturing processes can be simplified, and manufacturing costs can be reduced.

An N-type area and a P-type area of conventional PIN-type optical sensors are formed by injecting phosphine and borane during chemical vapor deposition (CVP) processes for manufacturing layers, thereby forming diodes. However, in conventional LTPS processes, conversion between an N-type semiconductor and a P-type semiconductor is realized by ion rejection and high-temperature activation processes. Therefore, manufacturing methods of conventional PIN-type optical sensors are not compatible with conventional LTPS processes. The switch component 20 and the light-sensing component 30 provided by the present embodiment can compatible with an ion injection process in LTPS processes. As such, mass production of under-display ambient light sensing technologies can be realized.

The TFT layer 40 includes a light-shielding layer 11, a buffer layer 12, a semiconductor layer 15, a gate insulating layer 13, a gate layer 16, an interlayer insulating layer 14, a source/drain electrode layer 17, a planarization layer 18, a common electrode layer 19, and a passivation layer 41.

Specifically, the light-shielding layer 11 is disposed on the substrate 10. The buffer layer 12 is disposed on the light-shielding layer 11 and the substrate 10. The semiconductor layer 15 is disposed on the buffer layer 12. The gate insulating layer 13 is disposed on the semiconductor layer 15 and the buffer layer 12. The gate layer 16 is disposed on the gate insulating layer 13. The interlayer insulating layer 14 is disposed on the gate layer 16 and the gate insulating layer 13. The source/drain electrode layer 17 is disposed on the interlayer insulating layer 14. The planarization layer 18 is disposed on the source/drain electrode layer 17 and the interlayer insulating layer 14. The common electrode layer 19 is disposed on the planarization layer 18. The passivation layer 41 is disposed on the common electrode layer 19.

Furthermore, the array substrate 100 includes a pixel electrode layer 42. The pixel electrode layer 42 is disposed on the passivation layer 41.

Furthermore, the source/drain electrode 17 includes an input electrode 23, a source pattern 171, a drain pattern 172, a touch control electrode 173, and a fingerprint signal electrode 174. The common electrode layer 19 includes a touch control wire 191 and a first electrode 192. The pixel electrode layer 42 includes a light-sensing electrode 32, a pixel electrode 421, a second electrode 422, and a signal connecting line 423. The light-shielding layer 11 includes a light-shielding part 24. The semiconductor layer 15 includes a first semiconductor 21, a second semiconductor 31, and a third semiconductor 151. The gate layer 16 includes a gate 22 and a gate pattern 161. Wherein, the first electrode 192 and the second electrode 422 individually constitute two electrode plates of a storage capacitor.

The switch component 20 includes the first semiconductor 21, the gate 22, and the input electrode 23. The switch component 20 transmits a bias voltage into the light-sensing component 30, leading to a reverse-biased light-sensing component 30. A driving transistor 50 includes the third semiconductor 151, the gate pattern 161, a source pattern 171, and a drain pattern 172. The driving transistor 50 drives a sub-pixel unit (not shown) of the array substrate 100.

Specifically, the interlayer insulating layer 14 includes the first through-hole 14A. The first through-hole 14A penetrates the interlayer insulating layer 14 and extends to a side of the first semiconductor 21 away from the substrate 10. The input electrode 23 is connected to the first semiconductor 21 by the first through-hole 14A. The planarization layer 18 includes the second through-hole 18A. The second through-hole 18A penetrates the planarization layer 18 and exposes the side of the interlayer insulating layer 14 away from the substrate 10. The passivation layer 41 is disposed on the planarization layer 18. The passivation layer 41 includes a third through-hole 41A. The third through-hole 41A penetrates the passivation layer 41 and extends to the side of the second semiconductor 31 away from the substrate 10 by the second through-hole 18A. The third through-hole 41A corresponds to the second through-hole 18A, and the passivation layer 41 covers the inner lateral wall of the second through-hole 18A. The light-sensing electrode 32 is connected to the second semiconductor 31 by the third through-hole 41A.

Furthermore, the planarization layer 18 includes a fourth through-hole 18B, a fifth through-hole 18C, and a sixth through-hole 18D. The fourth through-hole 18B exposes a side of the fingerprint signal electrode 174 away from the substrate 10. The fifth through-hole 18C exposes a side of the drain pattern 172 away from the substrate 10. The sixth through-hole 18D exposes a side of the touch control electrode 173 away from the substrate 10.

The passivation layer 41 further includes a seventh through-hole 41B and an eighth through-hole 41C. The seventh through-hole 41B corresponds to the fourth through-hole 18B, and the passivation layer 41 covers an inner lateral wall of the fourth through-hole 18B. The eighth through-hole 41C corresponds to the fifth through-hole 18C, and the passivation layer 41 covers an inner lateral wall of the fifth through-hole 18C.

The light-sensing electrode 32 is connected to the signal connecting line 423, and the signal connecting line 423 is connected to a fingerprint signal electrode 174 by the seventh through-hole 41B, thereby transmitting fingerprint signals. The pixel electrode 421 is connected to the drain pattern 172 by the eighth through-hole 41C. The touch control electrode 173 is connected to the touch control wire 191 by the sixth through-hole 18D, thereby realizing a touch control function.

In the present embodiment, the array substrate 100 includes a display area VA and a non-display area NA connected to the display area VA. The switch component 20 and the light-sensing component 30 are disposed in the non-display area NA. Therefore, an aperture of the display panel would not be affected.

Specifically, in one embodiment of the present disclosure, the non-display area NA is a gate driver on array (GOA) circuit area. The switch component 20 and the light-sensing component 30 are disposed in the GOA circuit area. Therefore, an aperture of the display panel would not be affected.

In the present embodiment, the GOA circuit area may be disposed at two sides of the display area VA (driving the array substrate from two sides). Also, the GOA circuit area may be disposed at only one side of the display area VA (driving the array substrate from a single side.).

In another embodiment of the present disclosure, the non-display area NA includes the GOA circuit area and a dummy pixel area disposed at at least one side of the display area VA. When the GOA circuit area and the dummy pixel area disposed at a same side of the display area VA, the GOA circuit area is disposed at a side of the dummy pixel area away from the display area VA.

The dummy pixel area does not display images, and is only configured to improve display uniformity of the display panel. By disposing the switch component 20 and the light-sensing component 30 at the dummy pixel area, an aperture of the display panel would not be affected, and wires in the GOA circuit area would not be interfered.

It should be noted the switch component 20 and the light-sensing component 30 may also be disposed in the display area VA of the array substrate 100, and the present disclosure is not limited thereto.

Figure 5:
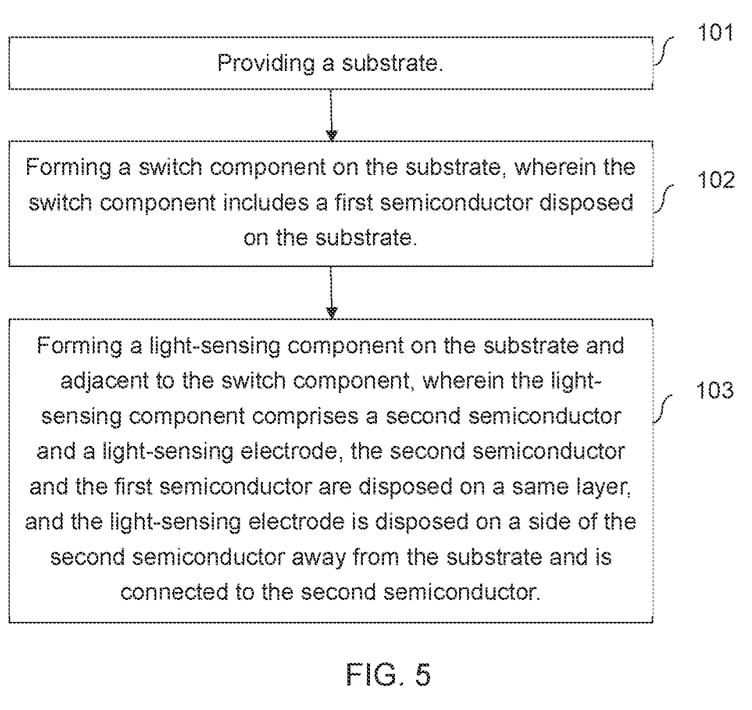
FIG. 5 is a first schematic flowchart showing a manufacturing method of the array substrate provided by the present disclosure.

The present disclosure further provides a method of manufacturing an array substrate. Please simultaneously refer to FIG. 1 and FIG. 5. FIG. 5 is a first schematic flowchart showing the method of manufacturing an array substrate. Specifically, the method includes following steps:

101, providing a substrate.

Specifically, a substrate 10 may be washed and baked in advance, thereby removing foreign particles, such as oil and grease, on a surface of the substrate 10.

Then, a light-shielding part 24 is formed on the substrate 10.

The substrate 10 may be a glass substrate, a quartz substrate, a resin substrate, a polyimide (PI) substrate, or other substrates which are not described here in detail. The light-shielding part 24 has a single-layer structure or a stacked-layer structure, which are formed of an opaque material. The opaque material may be Mo, Ti, a Mo/Ti stacked layer, or a Ti/Al stacked layer.

102, forming a switch component on the substrate, wherein the switch component includes a first semiconductor disposed on the substrate.

Specifically, a buffer layer 12 is deposited on the substrate 10 and the light-shielding part 24. A material of the buffer layer 12 may be one or more of silicon oxide, silicon nitride, or silicon oxynitride. The buffer layer 12 may be formed by a deposition process, a CMP process, a coating process, a sol-gel process. or other processes.

A first semiconductor 21 is formed on the buffer layer 12, and ions are injected into the first semiconductor 21 in two steps, thereby forming a first doping part 211, a second doping part 212, a channel part 213, a third doping part 214, and a fourth doping part 215.

Wherein, a material of the first semiconductor 21 is polysilicon. The thickness of the first semiconductor 21 ranges from 400 Å to 600 Å. The first doping part 211 and the fourth doping part 215 are N-type heavily doped. The second doping part 212 and the third doping part 214 are N-type lightly doped.

A gate insulating layer 13 is deposited on the first semiconductor 21 and the buffer layer 121. A gate 22 is formed on the gate insulating layer 13. An interlayer insulating layer 14 is formed on the gate 22 and the gate insulating layer 13. The interlayer insulating layer 14 is patterned to form a first through-hole 14A. The first through-hole 14A penetrates the interlayer insulating layer 14 and extends to the side of the first semiconductor 21 away from the substrate 10. An input electrode 23 is formed on the interlayer insulating layer 14. The input electrode 23 is connected to the first semiconductor 21 by the first through-hole 14A.

A material of the gate insulating layer 13 and a material of the interlayer insulating layer 14 may be silicon oxide, silicon nitride, silicon oxynitride, or a stacked layer formed of silicon oxide and silicon nitride. A material of the gate 22 is Ag, Al, Cu, Mo, a Mo/Al/Mo stacked layer, or a Mo/Cu stacked layer.

103, forming a light-sensing component on the substrate and adjacent to the switch component, wherein the light-sensing component includes a second semiconductor and a light-sensing electrode, the second semiconductor and the first semiconductor are disposed on a same layer, and the light-sensing electrode is disposed on a side of the second semiconductor away from the substrate and is connected to the second semiconductor.

Specifically, a second semiconductor 31 and the first semiconductor 21 may be simultaneously formed in the step 102. Ions may be injected into the first semiconductor 21 and the second semiconductor 31 at the same time, thereby forming a lightly doped N-type second semiconductor 31.

Furthermore, a planarization layer 18 is formed on the interlayer insulating layer 14. The planarization layer 18 is patterned to form a second through-hole 18A. The second through-hole 18A penetrates the planarization layer 18 and exposes the side of the interlayer insulating layer 14 away from the substrate 10. A passivation layer 41 is formed on the planarization layer 18. The passivation layer 41 is patterned to form a third through-hole 41A. The passivation layer 41 covers an inner lateral wall of the second through-hole 18A. A light-sensing electrode 32 is deposited on the passivation layer 41. The light-sensing electrode 32 is connected to the second semiconductor 31 by the third through-hole 41A.

Wherein, a material of the second semiconductor 21 is polysilicon. The thickness of the second semiconductor 31 ranges from 400 Å to 600 Å. A material of the light-sensing electrode 32 is a conductive material having high work function, thereby forming a Schottky junction between the light-sensing electrode 32 and the second semiconductor 31. Wherein, the conductive material having high work function may be indium zinc oxide, zinc oxide, or indium gallium zinc oxide.

Figure 6:
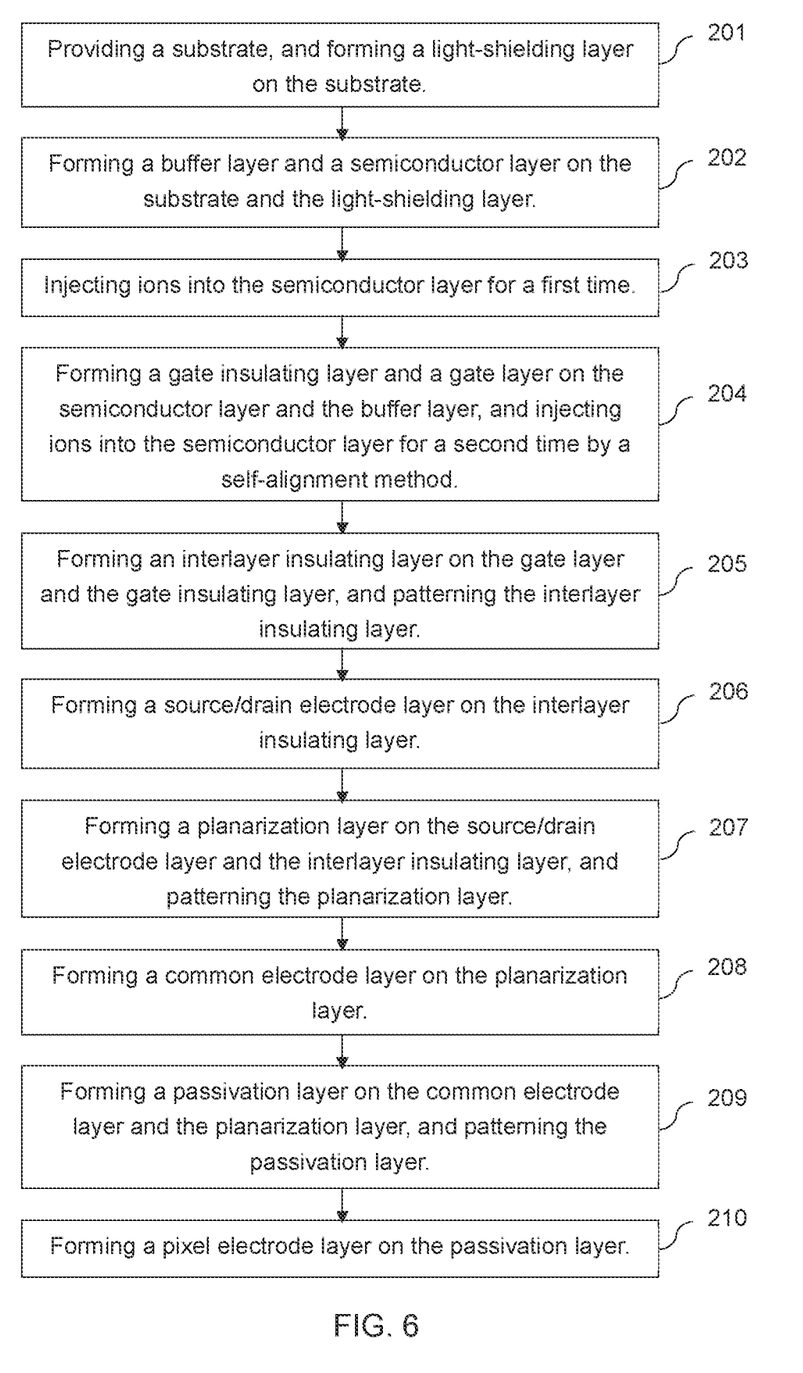
FIG. 6 is a second schematic flowchart showing the manufacturing method of the array substrate provided by the present disclosure.

Please simultaneously refer to FIG. 4 and FIG. 6. FIG. 6 is a second schematic flowchart showing the method of manufacturing the array substrate provided by the present disclosure. Specifically, the method includes following steps:

201, providing a substrate, and forming a light-shielding layer on the substrate.

Specifically, a substrate 10 may be washed and baked in advance, thereby removing foreign particles, such as oil and grease, on a surface of the substrate 10.

Then, an opaque material is deposited on the substrate 10 and is patterned by exposure and etching, thereby forming a light-shielding layer 11. The light-shielding layer 11 partly covers the substrate 10. The light-shielding layer 11 includes a light-shielding part 24.

Wherein, the substrate 10 may be a glass substrate, a quartz substrate, a resin substrate, a polyimide (PI) substrate, or other substrates which are not described here in detail. The opaque material may be Mo, Ti, a Mo/Ti stacked layer, or a Ti/Al stacked layer.

202, forming a buffer layer and a semiconductor layer on the substrate and the light-shielding layer.

Specifically, a buffer layer 12 is formed on the light-shielding layer 11. The buffer layer 12 covers the light-shielding layer 11 and the substrate 10.

An amorphous silicon layer is deposited on the buffer layer. A rapid thermal annealing process or a laser annealing process is conducted on the amorphous silicon layer to form a polysilicon layer. The polysilicon layer is patterned to form a semiconductor layer 15. The semiconductor layer 15 includes a first conductor 21 and a second conductor 31.

Wherein, a thickness of the semiconductor layer 15 ranges from 400 Å to 600 Å.

203, injecting ions into the semiconductor layer for a first time.

Specifically, phosphorus ions are doped into the semiconductor layer 15 by injection. As such, a first doping part 211 and a fourth doping part 215 are formed in the first semiconductor 21. The first doping part 211 and the fourth doping part 215 are N-type heavily doped.

204, forming a gate insulating layer and a gate layer on the semiconductor layer and the buffer layer, and injecting ions into the semiconductor layer for a second time by a self-alignment method.

Specifically, a gate insulating layer 13 is deposited on the semiconductor layer 15 and the buffer layer 12. Wherein, the gate insulating layer 13 may be a silicon oxide layer or a silicon nitride layer, or may be a stacked layer formed of silicon oxide and silicon nitride.

A first metal layer is deposited on the gate insulating layer 13 and is patterned to form a gate layer 16. The gate layer 16 includes a gate 22. A material of the metal layer is Ag, Al, Cu, Mo, a Mo/Al/Mo stacked layer, or a Mo/Cu stacked layer.

Ions are injected into the semiconductor layer 15 for a second time, and the gate layer 16 is a barrier layer. As such, a second doping part 212 and a third doping part 214 are formed in the first semiconductor 21. The second doping part 212 and the third doping part 214 are N-type lightly doped. Also, injecting ions into the second semiconductor 31 may make the second semiconductor 31 become an N-type semiconductor.

205, forming an interlayer insulating layer on the gate layer and the gate insulating layer, and patterning the interlayer insulating layer.

Specifically, an interlayer insulating layer 14 is deposited on the gate layer 16 and the gate insulating layer 13. The gate insulating layer 14 is hydrogenated and activated by a rapid thermal annealing process, and is patterned by exposure and etching, thereby forming a plurality of first through-holes 14A. Each of the first through-holes 14A penetrates the interlayer insulating layer 14 and extends to a side of the semiconductor layer 15 away from the substrate 10.

206, forming a source/drain electrode layer on the interlayer insulating layer.

A second metal layer is deposited on the interlayer insulating layer 14 and is patterned, thereby forming a source/drain electrode 17.

Wherein, the source/drain electrode layer 17 includes a source pattern 171, a drain pattern 172, a touch control electrode 173, a fingerprint signal electrode 174, and an input electrode 23. The source pattern 171 and the drain pattern 172 are respectively connected to the semiconductor layer 15 by corresponding first through holes 14A. The input electrode 23 is connected to the first semiconductor 21 by a corresponding first through hole 14A.

207, forming a planarization layer on the source/drain electrode layer and the interlayer insulating layer, and patterning the planarization layer.

Specifically, the planarization layer 18 is formed on the source/drain layer 17 and the interlayer insulating layer 14. The planarization layer 18 is patterned to form a second through-hole 18A, a fourth through-hole 18B, a fifth through-hole 18C, and a sixth through-hole 18D. The second through-hole 18A penetrates the planarization layer 18 and exposes a side of the interlayer insulating layer 14 away from the substrate 10. The fourth through-hole 18B exposes a side of the fingerprint signal electrode 174 away from the substrate 10. The fifth through-hole 18C exposes a side of the drain pattern 172 away from the substrate 10. The sixth through-hole 18D exposes a side of the touch control electrode 173 away from the substrate 10.

208, forming a common electrode layer on the planarization layer.

Specifically, a first transparent metal layer is deposited on the planarization layer 18 and is patterned, thereby forming a common electrode layer 19.

Wherein, the common electrode layer 19 includes a touch control wire 191 and a first electrode 192. The touch control electrode 173 and the touch control wire 191 are connected to each other by a through-hole, thereby realizing a touch control function.

209, forming a passivation layer on the common electrode layer and the planarization layer, and patterning the passivation layer.

Specifically, a passivation layer 41 is formed on the common electrode layer 19 and the planarization layer 18 and is patterned, thereby forming a third through-hole 41A, a seventh through-hole 41B, and an eighth through-hole 41C. The third through-hole 41A corresponds to the second through-hole 18A. The passivation layer 41 covers an inner lateral wall of the second through-hole 18A. The third through-hole 41A penetrates the passivation layer 41 and extends to a side of the second semiconductor 31 away from the substrate 10 by the second through-hole 18A. The seventh through-hole 41B corresponds to the fourth through-hole 18B, and the passivation layer 41 covers an inner lateral wall of the fourth through-hole 18B. The eighth through-hole 41C corresponds to the fifth through-hole 18C, and the passivation layer 41 covers an inner lateral wall of the fifth through-hole 18C.

210, forming a pixel electrode layer on the passivation layer.

Specifically, a second transparent metal layer is deposited on the passivation layer 41 and is patterned, thereby forming a pixel electrode layer 19.

In the method of manufacturing the array substrate provided by the present embodiment, the switch component 20 and the light-sensing component 30 are compatible with LTPS processes, realizing mass production of under-display ambient light sensing technologies. Moreover, the light-sensing component 30 having the Schottky junction can have a relatively strong capability to absorb light, improving sensitivity of the light-sensing component 30.

In the method of manufacturing the array substrate provided by the present embodiment, the switch component 20 and the light-sensing component 30 are compatible with LTPS processes, realizing mass production of under-display ambient light sensing technologies. Moreover, the light-sensing component 30 having the Schottky knot can have a relatively strong capability to absorb light, improving sensitivity of the light-sensing component 30.

In the description of the present disclosure, the term "pattern" denotes a step of forming a structure with a certain shape and may be a photo-etching process. The photo-etching process includes one or more steps including forming a material layer, coating a photoresist, exposure, developing, etching, or peeling off the photoresist. The above steps can be understood by those skilled in the art, and are not described here in detail.

Correspondingly, the present disclosure further includes a display panel, including any one of the above-mentioned array substrates. Specific details can be referred to the above contents and are not described here in detail. In addition, the display panel provided by the present disclosure may be an organic light-emitting diode (OLED) display panel, an active-matrix OLED display panel, a passive-matrix OLED display panel, a quantum dot OLED display panel, or a micro light-emitting diode display panel, which are not limited.

Figure 7:
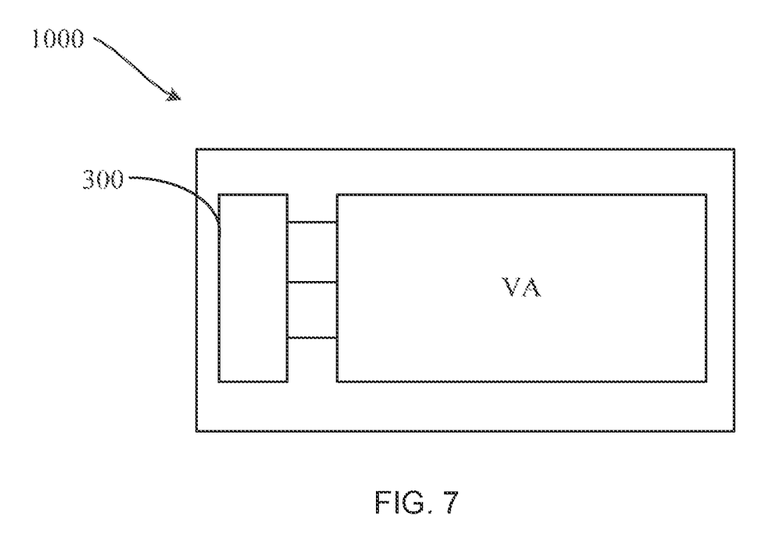
FIG. 7 is a structural schematic view showing a display panel of the present disclosure.

In another embodiment of the present disclosure, the display panel 1000 further includes a dummy pixel area (not shown). The dummy pixel area is defined between the GOA circuit 300 and the display area VA. The virtual dummy pixel area does not display images. By disposing the switch component 20 and the light-sensing component 30 at the dummy pixel area, an aperture of the display panel would not be affected, and wires in the GOA circuit area would not be interfered.

A display panel provided by the present disclosure includes an array substrate. The array substrate includes: a substrate; a switch component disposed on the substrate, wherein the switch component includes a first semiconductor disposed on the substrate; and a light-sensing component adjacent to the switch component and disposed on the substrate. The light-sensing component includes a second semiconductor and a light-sensing electrode. The second semiconductor and the first semiconductor are connected to each other and are disposed on a same layer. The light-sensing electrode is disposed on a side of the second semiconductor away from the substrate and is connected to the second semiconductor. A Schottky junction is formed between the second semiconductor and the light-sensing electrode, enlarging effective light-sensing area of the light-sensing component, improving sensitivity of the light-sensing component, and enhancing quality of the display panel.

A display panel provided by the present disclosure includes an array substrate. The array substrate includes: a substrate; a switch component disposed on the substrate, wherein the switch component includes a first semiconductor disposed on the substrate; and a light-sensing component adjacent to the switch component and disposed on the substrate. The light-sensing component includes a second semiconductor and a light-sensing electrode. The second semiconductor and the first semiconductor are connected to each other and are disposed on a same layer. The light-sensing electrode is disposed on a side of the second semiconductor away from the substrate and is connected to the second semiconductor. A Schottky knot is formed between the second semiconductor and the light-sensing electrode, enlarging effective light-sensing area of the light-sensing component, improving sensitivity of the light-sensing component, and enhancing quality of the display panel.

An array substrate, a manufacturing method thereof, and a display panel have been described in detail by the above embodiments, which illustrate principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. An array substrate, comprising:
a substrate;
a switch component disposed on the substrate, wherein the switch component comprises a first semiconductor disposed on the substrate; and
a light-sensing component disposed on the substrate and adjacent to the switch component, wherein the light-sensing component comprises a second semiconductor and a light-sensing electrode, the second semiconductor and the first semiconductor are connected to each other and are disposed on a same layer, and the light-sensing electrode is disposed on a side of the second semiconductor away from the substrate and is connected to the second semiconductor;
wherein the light-sensing electrode and the second semiconductor form a Schottky junction.

2. The array substrate of claim 1, wherein the second semiconductor is an intrinsic semiconductor or an N-type semiconductor.

3. The array substrate of claim 1, wherein the switch component further comprises:
a gate disposed on a side of the first semiconductor away from the substrate and insulated from the first semiconductor; and
an input electrode disposed on the side of the first semiconductor away from the substrate and connected to an end of the first semiconductor away from the second semiconductor.

4. The array substrate of claim 3, wherein the array substrate further comprises a thin-film transistor (TFT) layer, and the switch component and the light-sensing component are disposed in the TFT layer.

5. The array substrate of claim 4, wherein the TFT layer comprises:
a semiconductor layer disposed on the substrate and comprising the first semiconductor and the second semiconductor;
a gate insulating layer disposed on the semiconductor layer;
a gate layer disposed on the gate insulating layer and comprising the gate;
an interlayer insulating layer disposed on the gate insulating layer and the gate layer, wherein the interlayer insulating layer comprises a first through-hole penetrating the interlayer insulating layer and extending to the side of the first semiconductor away from the substrate; and
a source/drain electrode layer disposed on the interlayer insulating layer, wherein the source/drain electrode layer comprises the input electrode, and the input electrode is connected to the first semiconductor layer by the first through-hole.

6. The array substrate of claim 5, wherein the TFT layer further comprises:
a planarization layer disposed on the source/drain electrode layer and the interlayer insulating layer, wherein the planarization layer comprises a second through-hole penetrating the planarization layer and exposing a side of the interlayer insulating layer away from the substrate;
a common electrode layer disposed on the planarization layer; and
a passivation layer disposed on the common electrode layer and the planarization layer, wherein the passivation layer comprises a third through-hole penetrating the passivation layer and extending to the side of the second semiconductor away from the substrate by the second through-hole, a diameter of the second through-hole is greater than a diameter of the third through-hole, and the passivation layer covers an inner lateral wall of the second through-hole;
wherein the light-sensing electrode is connected to the second semiconductor by the third through-hole.

7. The array substrate of claim 6, further comprising a pixel electrode layer disposed on the passivation layer;
wherein the light-sensing electrode and the pixel electrode layer are disposed on a same layer.

8. The array substrate of claim 7, wherein the source/drain electrode comprises a source, a drain, a touch control, and a fingerprint signal electrode, the common electrode layer comprises a touch control wire and a first electrode, and the pixel electrode layer comprises a pixel electrode, a second electrode, and a signal connecting line.

9. The array substrate of claim 8, wherein the planarization layer further comprises a fourth through-hole, a fifth through-hole, and a sixth through-hole, the fourth through-hole exposes a side of the fingerprint signal electrode away from the substrate, the fifth through-hole exposes a side of the drain away from the substrate, and the sixth through-hole exposes a side of the touch control electrode away from the substrate; and the passivation layer further comprises a seventh through-hole and an eighth through-hole, the seventh through-hole corresponds to the fourth through-hole, the passivation layer covers an inner lateral wall of the fourth through-hole, the eighth through-hole corresponds to the fifth through-hole, and the passivation layer covers an inner lateral wall of the fifth through-hole.

10. The array substrate of claim 9, wherein the light-sensing electrode is connected to the signal connecting line, the signal connecting line is connected to the fingerprint signal electrode by the seventh through-hole, the pixel electrode is connected to the drain by the eighth through-hole, and the touch control electrode is connected to the touch control wire by the sixth through-hole.

11. The array substrate of claim 4, wherein the array substrate comprises a display area and a dummy pixel area, the dummy pixel area is positioned on at least one side of the display area, and the switch component and the light-sensing component are disposed in the dummy pixel area.

12. The array substrate of claim 1, further comprising a light-shielding part disposed on a side of the substrate near the first semiconductor, and a projection of the light-shielding part on the substrate at least covers a projection of the first semiconductor on the substrate.

13. The array substrate of claim 12, wherein the projection of the light-shielding part on the substrate covers the projection of the first semiconductor on the substrate and a projection of the second semiconductor on the substrate.

14. The array substrate of claim 1, wherein a material of the light-sensing electrode comprises indium zinc oxide, zinc oxide, or indium gallium zinc oxide.

15. The array substrate of claim 1, wherein a material of the first semiconductor and the second semiconductor is polysilicon.

16. The array substrate of claim 15, wherein a thickness of the second semiconductor ranges from 400 Å to 600 Å.

17. An array substrate, comprising:
a substrate;
a switch component disposed on the substrate, wherein the switch component comprises a first semiconductor disposed on the substrate; and a light-sensing component disposed on the substrate and adjacent to the switch component, wherein the light-sensing component comprises a second semiconductor and a light-sensing electrode, the second semiconductor and the first semiconductor are disposed on a same layer, and the light-sensing electrode is disposed on a side of the second semiconductor away from the substrate and is connected to the second semiconductor;

wherein the light-sensing electrode and the second semiconductor form a Schottky junction, wherein the second semiconductor is an intrinsic semiconductor or an N-type semiconductor, wherein the first semiconductor comprises a first doping part, a second doping part, a channel part, a third doping part, and a fourth doping part which are sequentially disposed along a horizontal direction, and the fourth doping part is connected to the second semiconductor; and wherein the first doping part and the fourth doping part are N-type heavily doped, and the second doping part, the third doping part, and the second semiconductor are N-type lightly doped.

18. A display panel, comprising an array substrate, wherein the array substrate comprises:
a substrate;
a switch component disposed on the substrate, wherein the switch component comprises a first semiconductor disposed on the substrate; and
a light-sensing component disposed on the substrate and adjacent to the switch component, wherein the light-sensing component comprises a second semiconductor and a light-sensing electrode, the second semiconductor and the first semiconductor are connected to each other and are disposed on a same layer, and the light-sensing electrode is disposed on a side of the second semiconductor away from the substrate and is connected to the second semiconductor;
wherein the light-sensing electrode and the second semiconductor form a Schottky junction.

19. The display panel of claim 18, wherein the second semiconductor is an intrinsic semiconductor or an N-type semiconductor.

20. The display panel of claim 18, wherein a material of the light-sensing electrode comprises indium zinc oxide, zinc oxide, or indium gallium zinc oxide.

* * * * *